United States Patent
Yoshimoto et al.

(10) Patent No.: US 7,812,700 B2
(45) Date of Patent: Oct. 12, 2010

(54) SURFACE-MOUNTED CHOKE COIL

(75) Inventors: Takayuki Yoshimoto, Fukuoka (JP); Takemasa Kondou, Fukuoka (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 849 days.

(21) Appl. No.: 11/668,779

(22) Filed: Jan. 30, 2007

(65) Prior Publication Data

US 2007/0188286 A1   Aug. 16, 2007

(30) Foreign Application Priority Data

Feb. 15, 2006   (JP) ............ P2006-037869

(51) Int. Cl.
*H01F 27/29*   (2006.01)

(52) U.S. Cl. ...................................... 336/192

(58) Field of Classification Search ............ 336/65, 336/90, 192, 200, 232
See application file for complete search history.

(56) References Cited

U.S. PATENT DOCUMENTS

| | | | | |
|---|---|---|---|---|
| 5,680,087 A | * | 10/1997 | Sakata et al. | 336/83 |
| 6,788,181 B2 | * | 9/2004 | Yeh et al. | 336/192 |
| 7,042,324 B2 | * | 5/2006 | Watanabe | 336/192 |
| 7,463,130 B2 | * | 12/2008 | Oki | 336/192 |
| 2004/0189433 A1 | * | 9/2004 | Ooki | 336/200 |

FOREIGN PATENT DOCUMENTS

| | | |
|---|---|---|
| JP | 11-67520 | 3/1993 |
| JP | 10-55912 | 2/1998 |
| JP | 2005-150470 | 6/2005 |
| JP | 2005-210055 | 8/2005 |

OTHER PUBLICATIONS

"The Submission of Publication and the like" with English translations.

* cited by examiner

*Primary Examiner*—Tuyen Nguyen
(74) *Attorney, Agent, or Firm*—Whitham Curtis Christofferson & Cook, PC

(57) ABSTRACT

In a choke coil adapted to be surface-mounted on a board, a drum core including a core rod, and a circular first flange provided on a lower end of the core rod. A coil is wound around the core rod. Each of a pair of electrodes is electrically connected to an associated one end of the coil, and includes a first part provided on a lower face of the first flange adapted to oppose a connection land on the board and a second part provided on a side face of the first flange. The second part of each of the electrodes is adapted to hold a solder fillet together with the land. In a case where a hypothetic square circumscribing an outer periphery of the first flange is defined, the second part is located within the square and on a line connecting diagonal corners of the square.

5 Claims, 3 Drawing Sheets

SURFACE-MOUNTED CHOKE COIL

BACKGROUND

The present invention relates to a surface-mounted choke coil, and more particularly to a surface-mounted choke coil with the smaller mounting area and the higher mounting density, in which the formation of a solder fillet can be easily confirmed at the mounting time.

The related-art surface-mounted choke coil is illustrated in FIGS. 3A to 3E. In the choke coil, a drum core 2 having a core rod is provided. The drum core 2 is almost rectangular in plan view with four corners cut away, and has a pair of external electrodes 3 fixed on its lower face. The solder fillet formation parts 3a also serving as drum core positioning members are extending on the lateral face of the drum core 2 from the external electrodes. The coil, not shown, is wound around the core rod of the drum core 2, with its both ends being connected via solder connection parts 4 to the one pair of external electrodes. A part of the coil is appropriately coated with a adhesive agent. The surface-mounted choke coil 1 is contained within a square area 5 as large as, e.g., 3×3 $mm^2$, conforming to the prescribed size standard, including the solder fillet formation parts 3a.

FIGS. 3C and 3D show the connection lands 7 to which the one pair of external electrodes are soldered when the surface-mounted choke coil 1 is directly mounted on a board 6. The connection lands 7 are formed so as to straddle the boundaries of the square area 5. As shown in FIG. 3E, when the external electrode 3 is soldered to the connection land 7, the molten solder rises up the solder fillet formation part 3a to form a solder fillet 8 between the solder fillet formation part 3a and the connection land 7.

This solder fillet 8 formed at the mounting time assures that the external electrode 3 is securely connected to the connection land 7. Therefore, there is a demand that the surface-mounted choke coil 1 allows the solder fillet 8 formed at the mounting time to be confirmed from the outside.

Japanese Patent Publication No. 2005-150470A discloses a surface-mounted choke coil comprising: a magnetic core having a core rod and a flange formed on one end of the core so as to have a T-shaped longitudinal cross section; a pair of external electrodes each of which extends from a lower face of the flange to a side face of the flange so as to have an L-shaped longitudinal cross section; a coil both ends of which are electrically connected to the external electrodes is wound around the core rod; a resin layer containing magnetic powder and covering the coil; and a silver paste layer and a solder plating layer which are provided on a lower face of each of the external electrodes and adapted to be used for surface-mounting.

The surface-mounted choke coil of as shown in FIGS. 3A to 3E is contained within the square area 5 conforming to the prescribed size standard, including the solder fillet formation parts 3a extending on the lateral face of the drum core 2. Therefore, the drum core 2 is deprived of the outer size by the thickness of the solder fillet formation parts 3a, with the volume of the drum core 2 being smaller. Since the performance of the choke coil depends on the volume of core, the surface-mounted choke coil is prevented from being improved in the performance. Further, to confirm the solder fillet 8 from the outside, the solder fillet formation part 3a is stood on the lateral face, the connection land 7 on the board 6 is formed so as to straddle the boundaries of the square area 5, and the solder fillets 8 are formed in a portion beyond the boundaries of the square area 5. Therefore, the mounting area is increased to impede the higher density mounting.

In the surface-mounted choke coil disclosed in Japanese Patent Publication No. 2005-150470A, since the external electrodes extend to the side face of the flange, the mounting area is increased as much as the thickness of the electrodes provided on the side face of the flange. Accordingly, the high density mounting is impeded due to the reason as described the above. In addition, the external electrodes are connected to connection lands formed on a board by the solder plating layer provided on the lower face of the external electrodes. Therefore, it is difficult to confirm the connection part with the solder plating layer.

SUMMARY

It is therefore one advantageous aspect of the invention to provide a surface-mounted choke coil with smaller mounting area and at higher mounting density to make the mounting area smaller and the volume of a drum core larger, and to improve the performance by suppressing the magnetic resistance of the drum core, while facilitating the confirmation of the formation of solder fillet.

According to one aspect of the invention, there is provided a choke coil, adapted to be surface-mounted on a board, comprising:

a drum core, comprising a core rod, and a circular first flange, provided on a lower end of the core rod;

a coil, wound around the core rod; and a pair of electrodes, each of which is electrically connected to an associated one end of the coil, and includes a first part provided on a lower face of the first flange adapted to oppose a connection land on the board and a second part provided on a side face of the first flange, wherein:

the second part of each of the electrodes is adapted to hold a solder fillet together with the land; and in a case where a hypothetic square circumscribing an outer periphery of the first flange is defined, the second part is located within the square and on a line connecting diagonal corners of the square.

The first part of each of the electrodes may be notched.

The drum core may further comprise a circular second flange, provided on an upper end of the core rod. A heat-curing adhesive agent containing magnetic powder may be filled between the first flange and the second flange so as to cover the coil.

The adhesive agent may have at least such a viscosity that suppresses precipitation of the magnetic powder before the adhesive agent is heat-cured.

The adhesive agent may have at most such a hardness that prevents crack of the drum core when the adhesive agent is heat-cured.

DETAILED DESCRIPTION OF EXEMPLARY EMBODIMENTS

Figure 1A:
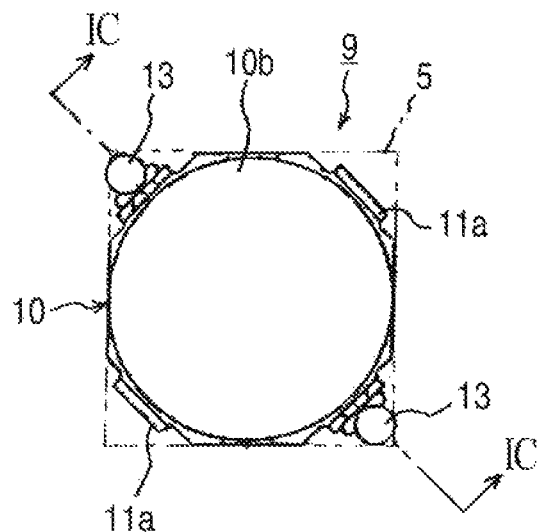
FIG. 1A is a plan view of a surface-mounted choke coil according to one embodiment of the invention.
Figure 1C:
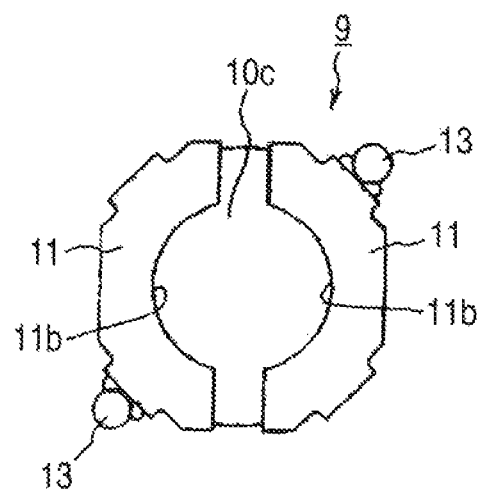
FIG. 1C is a bottom view of the surface-mounted choke coil.
Figure 1B:
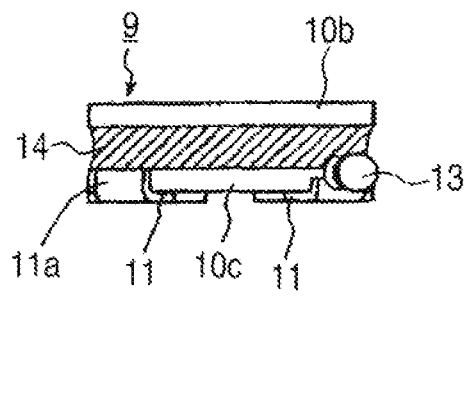
FIG. 1B is a side view of the surface-mounted choke coil.
Figure 1D:
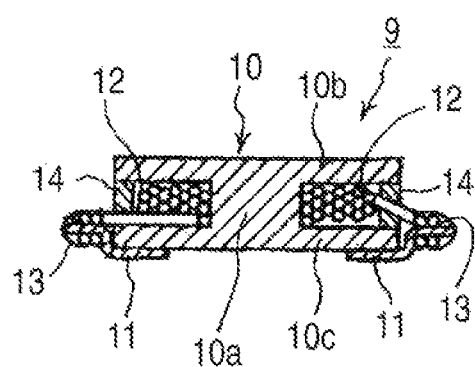
FIG. 1D is a section view taken along a line IC-IC in FIG. 1A.
Figure 1E:
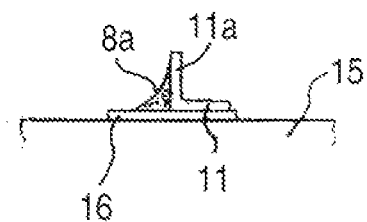
FIG. 1E is an enlarged side view of an external electrode of the surface-mounted choke coil and a connection land on a board, showing a state that a solder fillet is held therebetween.

Exemplary embodiments of the invention will be described below in detail with reference to the accompanying drawings.

As shown in FIGS. 1A to 1D, a surface-mounted choke coil 9 according to one embodiment of the invention is provided with a drum core 10 having an upper flange 10b and a lower flange 10c formed integrally with a core rod 10a at both upper and lower ends of the core rod 10a. The drum core 10 is formed circular in plan view, and one pair of external electrodes 11 is bonded by adhesive on a lower face of the lower flange 10c.

The external electrodes 11 have solder fillet formation parts 11a also serving as the drum core positioning members extending on side faces of the lower flange 10c so as to oppose the diagonal corners of the square area 5 conforming to the prescribed size standard.

In this manner, the surface-mounted choke coil 9 is formed in a size contained within the square area 5, including the solder fillet formation parts 11a within the square area 5.

Arcuate notches 11b are formed at opposing parts of the external electrodes 11 provided on the lower face of the lower flange 10c so that the contact area between the one pair of external electrodes 11 and the drum core 10 becomes smaller by the amount of notched portion, thereby reducing the weight of the choke coil 9.

A coil 12 is wound around the core rod 10a in the drum core 10, and both ends of the coil 12 are connected via solder connection parts 13 made of lead-free solder to the pair of external electrodes 11. Adhesive agent 14 containing magnetic powder is filled between the upper flange 10b and the lower flange 10c to cover the coil 12.

The adhesive agent 14 has at least one of a viscosity of prescribed value or more capable of suppressing precipitation of contained magnetic powder, and a hardness of a prescribed value or less capable of preventing crack of the drum core 10 after heat curing.

In a case where the adhesive agent 14 having such a viscosity is used, the magnetic permeability of the adhesive agent 14 is prevented from being lower by suppressing precipitation of the magnetic powder in the adhesive agent 14 before heat curing. In a case where the adhesive agent having such a hardness is used, an increased magnetic resistance of the drum core 10 is suppressed by preventing crack of the drum core 10, thereby the performance of the choke coil 9 can be improved.

Figure 2A:
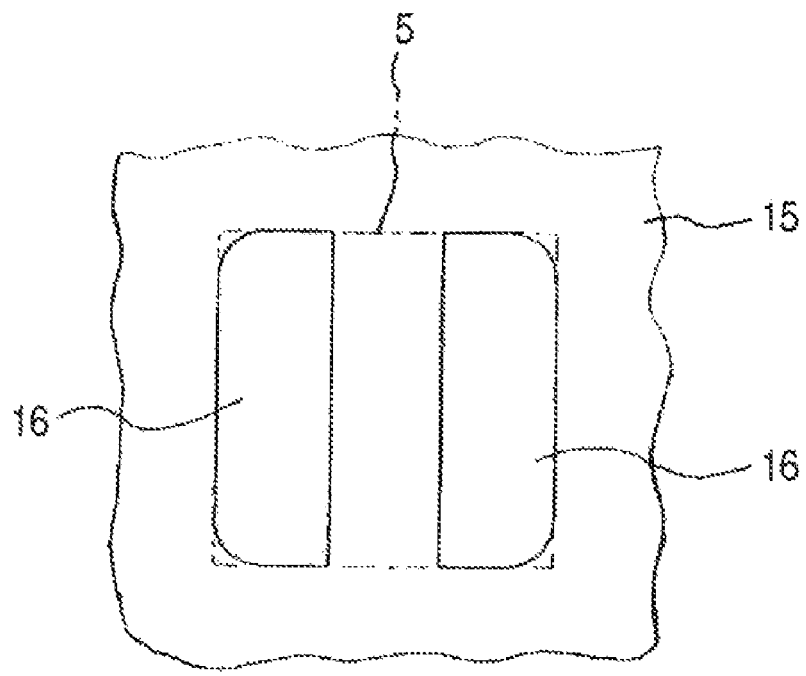
FIG. 2A is a plan view of connection lands on the board.
Figure 2B:
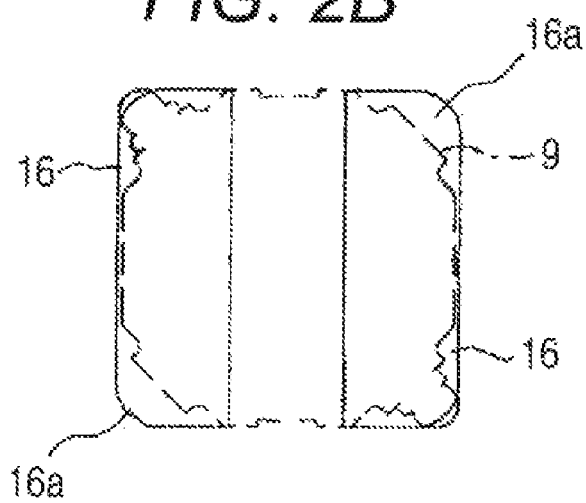
FIG. 2B is a schematic view showing a position relationship between the surface-mounted choke coil and the connection lands.
Figure 3A:
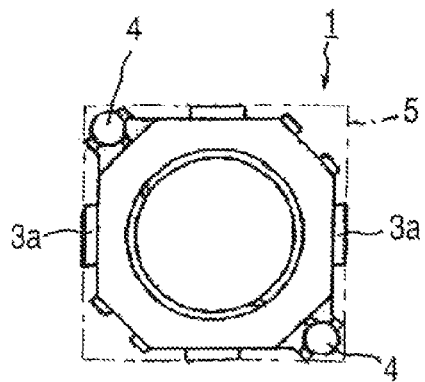
FIG. 3A is a plan view of a related-art surface-mounted choke coil.
Figure 3B:
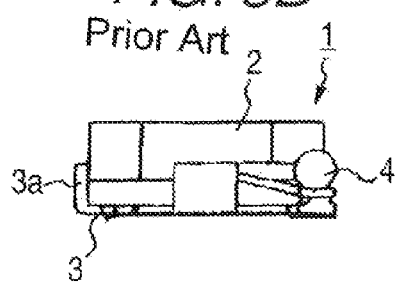
FIG. 3B is a side view of the related-art surface-mounted choke coil.
Figure 3C:
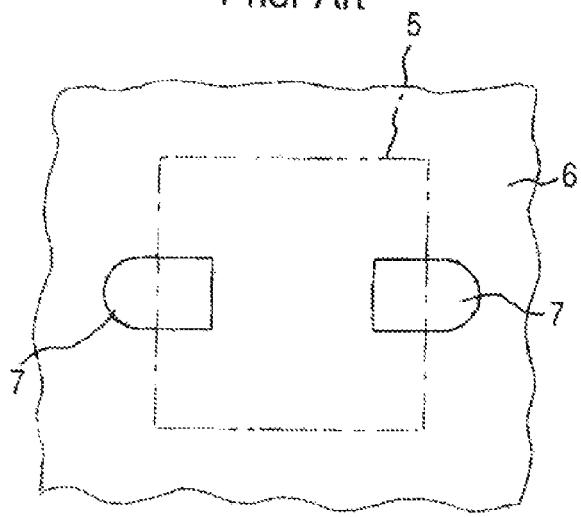
FIG. 3C is a plan view of connection lands on a board on which the related-art surface-mounted choke coil.
Figure 3D:
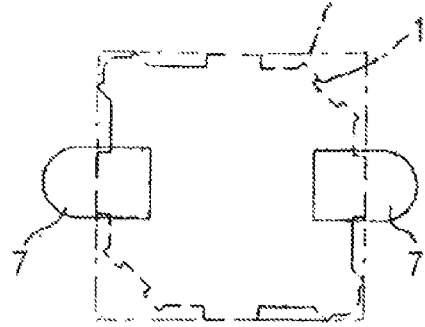
FIG. 3D is a schematic view showing a position relationship between the related-art surface-mounted choke coil and the connection lands shown in FIG. 3C.
Figure 3E:
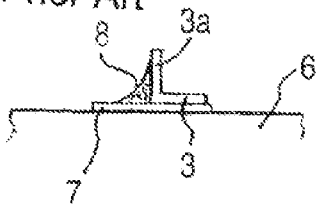
FIG. 3E is an enlarged side view of an external electrode of the related-art surface-mounted choke coil and one of the connection lands shown in FIG. 3C, showing a state that a solder fillet is held therebetween.

Referring to FIGS. 2A and 2B, the mounting of the surface-mounted choke coil on a board 15 will be described below. FIG. 2A shows one pair of connection lands 16 to which the one pair of external electrodes 11 is soldered before the surface-mounted choke coil 9 is mounted on the board 15. The one pair of connection lands 16 is arranged within the square area 5.

When the surface-mounted choke coil 9 is directly mounted on the surface of the board 15 by soldering the external electrodes 11 in the surface-mounted choke coil 9 to the connection lands 16, the molten solder rises up the solder fillet formation parts 11a to form the solder fillets 8a between the solder fillet formation parts 11a and the connection lands 16. Here, the solder fillets 8a are formed at the side positions of the lower flange 10c to allow the formation to be confirmed and at corner portions 16a of connection lands 16 located within the square area 5, as shown in FIG. 2B.

Therefore, the volume of the drum core 10 which is circular in plan view can be increased almost up to the boundaries of the square area 5. In this regard, the performance of the surface-mounted choke coil 9 can be improved because the performance of the choke coil depends on the volume of the core.

The solder fillets are formed at the corner positions 16a of the connection lands 16 contained within the square area 5, so that the mounting area is reduced, whereby the surface-mounted choke coil 9 appropriately dealing with the high-density mounting can be provided.

Since the solder fillets 8 are formed at the side positions of the lower flange 10c, the formation of the solder fillet can be easily confirmed.

Although only some exemplary embodiments of the invention have been described in detail above, those skilled in the art will readily appreciated that many modifications are possible in the exemplary embodiments without materially departing from the novel teachings and advantages of the invention. Accordingly, all such modifications are intended to be included within the scope of the invention.

The disclosure of Japanese Patent Application No. 2006-37869 filed Feb. 15, 2006 including specification, drawings and claims is incorporated herein by reference in its entirety.

What is claimed is:

1. A choke coil, adapted to be surface-mounted on a board, comprising:

a drum core, comprising a core rod, and a circular first flange, provided on a lower end of the core rod;

a coil, wound around the core rod; and a pair of electrodes, each of which is electrically connected to an associated one end of the coil through a connection part, and includes a first part provided on a lower face of the first flange adapted to oppose a connection land on the board and a second part provided on a side face of the first flange, wherein:

the second part of each of the electrodes is adapted to hold a solder fillet together with the land; and in a case where a hypothetic square circumscribing an outer periphery of the first flange is defined, the second part is located within the square and on a diagonal line connecting diagonal corners of the square, and the connection part is located within the square and on another diagonal line connecting the other diagonal corners of the square.

2. The choke coil as set forth in claim 1, wherein:

the first part of each of the electrodes is notched.

3. The choke coil as set forth in claim 1, wherein:

the drum core further comprises a circular second flange, provided on an upper end of the core rod; and a heat-curing adhesive agent containing magnetic powder is filled between the first flange and the second flange so as to cover the coil.

4. The choke coil as set forth in claim 3, wherein:
the adhesive agent has at least such a viscosity that suppresses precipitation of the magnetic powder before the adhesive agent is heat-cured.

5. The choke coil as set forth in claim 3, wherein:
the adhesive agent has at most such a hardness that prevents crack of the drum core when the adhesive agent is heat-cured.

* * * * *